(12) United States Patent
Wilks et al.

(10) Patent No.: US 10,893,633 B2
(45) Date of Patent: Jan. 12, 2021

(54) METHOD OF COOLING AN ELECTRONICS CABINET

(71) Applicant: Airedale International Air Conditioning Ltd., Leeds (GB)

(72) Inventors: David Samuel Wilks, Bradford (GB); Nino Veselinov Nenchev, Huddersfield (GB)

(73) Assignee: MODINE MANUFACTURING COMPANY, Racine, WI (US)

( * ) Notice: Subject to any disclaimer, the term of this patent is extended or adjusted under 35 U.S.C. 154(b) by 0 days.

(21) Appl. No.: 16/662,891

(22) Filed: Oct. 24, 2019

(65) Prior Publication Data

US 2020/0154610 A1 May 14, 2020

Related U.S. Application Data

(60) Provisional application No. 62/760,384, filed on Nov. 13, 2018.

(51) Int. Cl.
*H05K 7/20* (2006.01)
(52) U.S. Cl.
CPC ....... *H05K 7/20745* (2013.01); *H05K 7/2079* (2013.01); *H05K 7/20254* (2013.01);
(Continued)
(58) Field of Classification Search
CPC .......... H05K 7/20254; H05K 7/20509; H05K 7/20745; H05K 7/20781; H05K 7/2079; H05K 7/20818; H05K 7/20827
See application file for complete search history.

(56) References Cited

U.S. PATENT DOCUMENTS 8,514,575 B2  8/2013  Goth et al.
9,052,722 B2  6/2015  Chainer et al.
(Continued)

OTHER PUBLICATIONS

Extended European Search Report for European Patent Application No. 19208040.6, dated Apr. 14, 2020, European Patent Office (11 pages).

*Primary Examiner* — Jacob R Crum
(74) *Attorney, Agent, or Firm* — Michael Best & Friedrich; Jeroen Valensa; Michael Bergnach

(57) ABSTRACT

A method of cooling an electronics cabinet includes inducing a flow of cooling air to enter into the electronics cabinet, passing the flow of cooling air over electronic modules arranged within the electronics cabinet to convectively transfer heat to the flow of cooling air from the electronic modules, and directing the flow of cooling air through a door heat exchanger at an end of the electronics cabinet to exhaust the flow of cooling air from the cabinet. A first coolant flow is directed through the door heat exchanger, and heat is transferred from the flow of cooling air to the first coolant flow as they pass through the door heat exchanger. A second coolant flow is circulated through a coolant loop that is arranged within the electronics cabinet, and passes though cold plates that are joined to at least some of the electronic modules to transfer heat from those modules to the second coolant flow. Heat from the second coolant flow is transferred to the first coolant flow in a coolant-to-coolant heat exchanger arranged within the electronics cabinet. Heat is subsequently rejected from the first coolant flow at a location remote from the electronics cabinet.

20 Claims, 4 Drawing Sheets

(52) U.S. Cl.
CPC ..... *H05K 7/20509* (2013.01); *H05K 7/20781* (2013.01); *H05K 7/20818* (2013.01)

(56) References Cited

U.S. PATENT DOCUMENTS

| | | |
|---|---|---|
| 2008/0068793 A1 | 3/2008 | Ishimine |
| 2010/0033931 A1* | 2/2010 | Miyazawa ......... H05K 7/20745 361/696 |
| 2010/0085708 A1 | 4/2010 | Martin et al. |
| 2011/0056675 A1* | 3/2011 | Barringer ........... H05K 7/20736 165/299 |
| 2012/0300398 A1* | 11/2012 | Eckberg ............. H05K 7/20718 361/692 |
| 2013/0104383 A1 | 5/2013 | Campbell et al. |
| 2014/0124163 A1 | 5/2014 | Campbell et al. |
| 2014/0133099 A1* | 5/2014 | Campbell .......... H05K 7/20781 361/698 |
| 2014/0202678 A1 | 7/2014 | Goth et al. |
| 2014/0355201 A1* | 12/2014 | Alshinnawi ........ H05K 7/20745 361/679.47 |
| 2016/0048179 A1* | 2/2016 | Watanabe .................. G06F 1/20 361/679.52 |
| 2016/0242319 A1* | 8/2016 | Edwards ............... F04D 29/586 |
| 2017/0064873 A1* | 3/2017 | Kerrigan ............ H05K 7/20781 |
| 2017/0325354 A1* | 11/2017 | Lee ..................... H05K 5/0213 |
| 2018/0027698 A1 | 1/2018 | Cader et al. |
| 2018/0042140 A1 | 2/2018 | Pan et al. |

\* cited by examiner

METHOD OF COOLING AN ELECTRONICS CABINET

CROSS-REFERENCE TO RELATED APPLICATIONS

This application claims priority to U.S. provisional patent application No. 62/760,384, filed on Nov. 13, 2018, the entire contents of which are hereby incorporated by reference in their entirety.

BACKGROUND

The present invention relates to the cooling of electronic modules, and particularly relates to the cooling of such modules within electronics cabinets within a data center.

Electronic modules dissipate waste heat during their operation. In many cases, the rate at which the heat is dissipated is great enough that the temperature of the electronic module will rise to an unacceptably high level unless that heat is removed from the immediate environment of the electronics. This problem is especially pronounced when multiple such electronic modules are housed in close proximity to one another.

In one particularly relevant example, computer servers are presented as individual electronic modules that are housed within an electronics cabinet. These modules typically fill such a cabinet with only minimal space between them, resulting in a high concentration of heat dissipation. Furthermore, multiple such cabinets are often arranged, typically in rows with aisles between them, within a room of a data center. The electronics cabinets are typically provided with fans that pull room from the air in from the aisle on one side of the row and exhaust the air into the aisle on the opposite side of the row. As the room air passes through the cabinet, it convectively transfers heat from the electronic modules in order to maintain their temperature to an acceptable level. Such a solution requires cooling of the air within the room to avoid steadily increasing the room temperature due to the dissipated heat. A computer room air conditioning (CRAC) unit is typically placed within the room to cool the air in the room. However, hot spots often remain around the cabinets themselves, thus requiring the CRAC unit to cool the room to a lower overall temperature, which is inefficient.

SUMMARY

According to some embodiments of the invention, a method of cooling an electronics cabinet is provided. The method includes inducing a flow of cooling air to enter into the electronics cabinet, passing the flow of cooling air over electronic modules arranged within the electronics cabinet to convectively transfer heat to the flow of cooling air from the electronic modules at a first heat transfer rate, and directing the flow of cooling air through a door heat exchanger arranged at an end of the electronics cabinet to exhaust the flow of cooling air from the electronics cabinet. The method further includes receiving a first coolant flow into the electronics cabinet and directing the first coolant flow through the door heat exchanger. Heat is transferred from the flow of cooling air to the first coolant flow at a second heat transfer rate as the flow of cooling and the first coolant flow both pass through the door heat exchanger. A second coolant flow is circulated through a coolant loop that is arranged within the electronics cabinet and passes though cold plates that are joined to at least some of the electronic modules to transfer heat from those modules to the second coolant flow at a third heat transfer rate. Heat from the second coolant flow is transferred to the first coolant flow at a fourth heat transfer rate in a coolant-to-coolant heat exchanger arranged within the electronics cabinet. Heat is subsequently rejected from the first coolant flow at a location remote from the electronics cabinet.

In at least some such embodiments, the sum of the heat transfer rate and the third heat transfer rate is equal to the total rate of heat generation of the electronic modules. In some embodiments the fourth heat transfer rate equal to the third heat transfer rate, and in some embodiments the second heat transfer rate is equal to the first heat transfer rate. In some embodiments the fourth heat transfer rate is greater than or less than the third heat transfer rate. In some embodiments the second heat transfer rate is greater than or less than the first heat transfer rate.

In some embodiments the air is drawn into the electronics cabinet at a first temperature and is exhausted from the electronics cabinet at a second temperature. In some such embodiments the second temperature is equal to the first temperature, while in other such embodiments the second temperature is greater than or less than the first temperature.

In some embodiments the coolant-to-coolant heat exchanger is arranged downstream of the door heat exchanger with respect to the first coolant flow, so that as the first coolant flow passes through the electronics cabinet it passes first through the door heat exchanger and subsequently through the coolant-to-coolant heat exchanger. In other embodiments the flow of the first coolant is reversed so that it passes through the door heat exchanger after passing through the coolant-to-coolant heat exchanger.

In some embodiments, a first temperature of the air is measured as the air enters the electronics cabinet, and a second temperature of the air is measured as the air exits the door heat exchanger. The first temperature and the second temperature are compared using a control circuit of the cooling system, and a temperature differential is calculated. When a temperature differential exists, such that the second temperature is not equal to the first temperature, the control circuit operates to change a flow rate of one of the fluid flows in the cooling system.

In some such embodiments, the control circuit operates to change the flow rate of the cooling air by adjusting the rotational speed of the fans. In other embodiments, the control circuit operates to change the flow rate of the second coolant flow, while in still other embodiments the control circuit operates to change the flow rate of the first coolant flow. In some embodiments the control circuit operates to change the flow rate of more than one of the cooling air, the first coolant flow, and the second coolant flow.

In some embodiments the control circuit increases the flow rate of at least one of the flow of ambient air, the first coolant flow, and the second coolant flow when the second temperature exceeds the first temperature. In some embodiments the control circuit decreases the flow rate of at least one of the flow of ambient air, the first coolant flow, and the second coolant flow when the first temperature exceeds the second temperature.

According to another embodiment of the invention, a cooling system for an electronics cabinet includes a door heat exchanger mounted to a face of the electronics cabinet, a heat rejection system located remotely from the electronics cabinet, and a coolant-to-coolant heat exchanger arranged within the electronics cabinet. The door heat exchanger includes one or more fans to draw cooling air through the electronics cabinet and to pass the cooling air over heat exchange surfaces of the door heat exchanger. The heat rejection system is fluidly coupled to the door heat exchanger by way of a first coolant loop, which extends through the door heat exchanger to receive heat from the cooling air by way of the heat exchange surfaces.

The cooling system further includes cold plates that are arranged within the electronics cabinet and are coupled to electronic components contained within the electronics cabinet. The cold plates are connected to a second coolant loop that is arranged within the cabinet, and heat is transferred from the electronic components to the second coolant loop by way of the cold plates. The coolant-to-coolant heat exchanger is connected to both the first coolant loop and the second coolant loop to transfer heat from the second coolant loop to the first coolant loop.

In at least some embodiments, the coolant-to-coolant heat exchanger is arranged downstream of the door heat exchanger along the first coolant loop. In other embodiments the coolant-to-coolant heat exchanger is arranged upstream of the door heat exchanger along the first coolant loop. In still other embodiments the coolant-to-coolant heat exchanger and the door heat exchanger are arranged in parallel along the first coolant loop.

In some embodiments, the coolant-to-coolant heat exchanger is part of a fluid distribution unit that is arranged within the electronics cabinet. The fluid distribution can include other ancillary components for the second coolant loop, including but not limited to a pump to circulate a flow of coolant along the second coolant loop.

In some embodiments, the cooling system can include a pair of headers that are arranged within the electronics cabinet along the second coolant loop. A first one of the pair of headers is connected to the fluid distribution unit and to the cold plates and receives the flow of coolant from the fluid distribution unit and subsequently distributes the flow of coolant to the cold plates. The second one of the pair of headers is connected to the fluid distribution unit and to the cold plates and receives the flow of coolant from the cold plates and return the flow of coolant back to the fluid distribution unit.

The coolants that are circulated along the first and second coolant loops can be any variety of coolant, including water, glycol, a water-glycol mixture, thermal oil, refrigerant, or any other known liquid, vapor, or liquid-vapor fluid generally used as a coolant. In some embodiments the same type of coolant may be used in both loops, while in other embodiments each of the coolant loops uses a different type of coolant. It may be especially preferable for one or both of the coolant to be a fluid that experiences a phase change along the coolant loop. By way of example, the coolant that is circulated along the second coolant can be a pumped refrigerant that is evaporated in the cold plates and is condensed in the coolant-to-coolant heat exchanger. Such a coolant can provide particularly effective cooling of the electronic components that are coupled to the cold plates.

The coolant-to-coolant heat exchanger can be arranged within any part of the electronics cabinet, including in the door heat exchanger.

DETAILED DESCRIPTION

Before any embodiments of the invention are explained in detail, it is to be understood that the invention is not limited in its application to the details of construction and the arrangement of components set forth in the following description or illustrated in the accompanying drawings. The invention is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless specified or limited otherwise, the terms "mounted," "connected," "supported," and "coupled" and variations thereof are used broadly and encompass both direct and indirect mountings, connections, supports, and couplings. Further, "connected" and "coupled" are not restricted to physical or mechanical connections or couplings.

Figure 1:
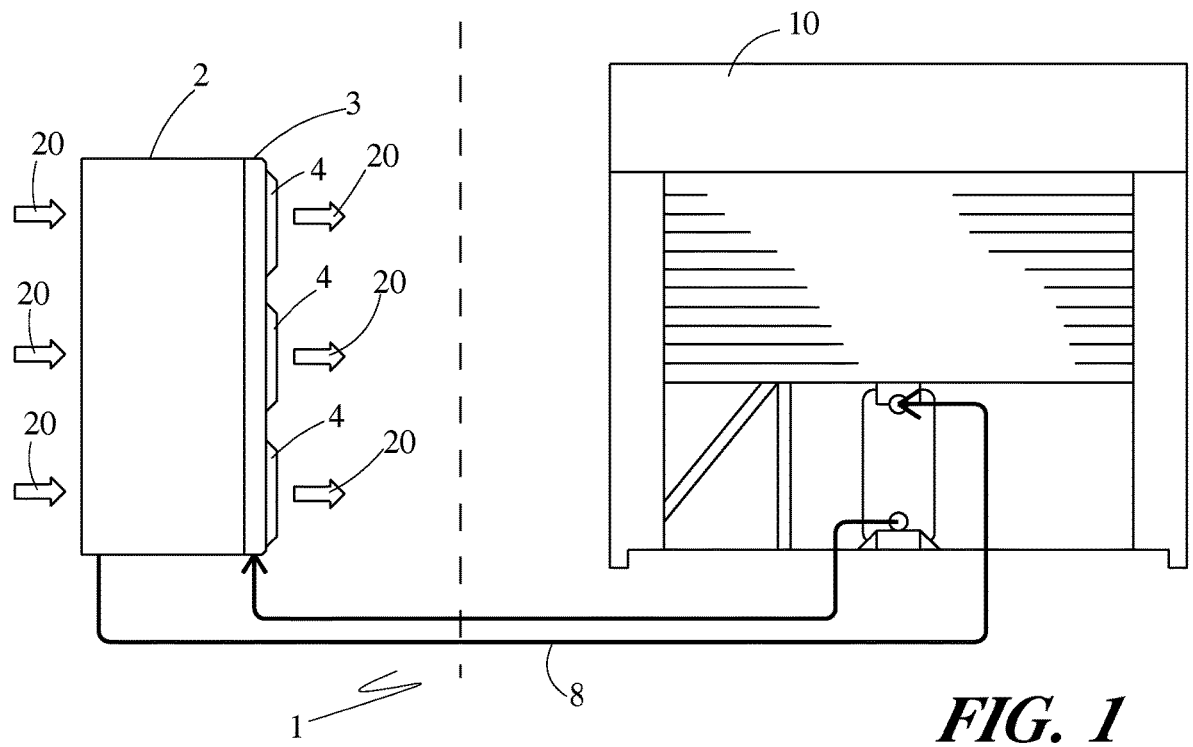
FIG. 1 is a diagram showing portions of a cooling system according to at least some embodiments of the invention.
Figure 2:
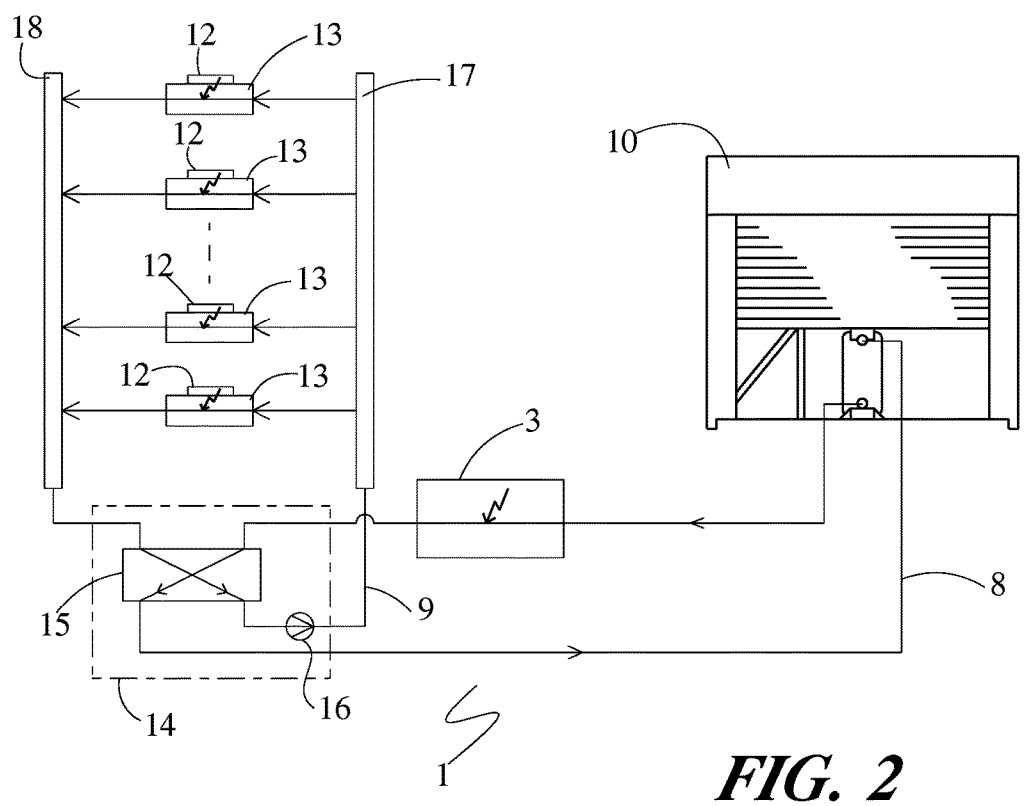
FIG. 2 is a schematic view of the cooling system of FIG. 1.
Figure 3:
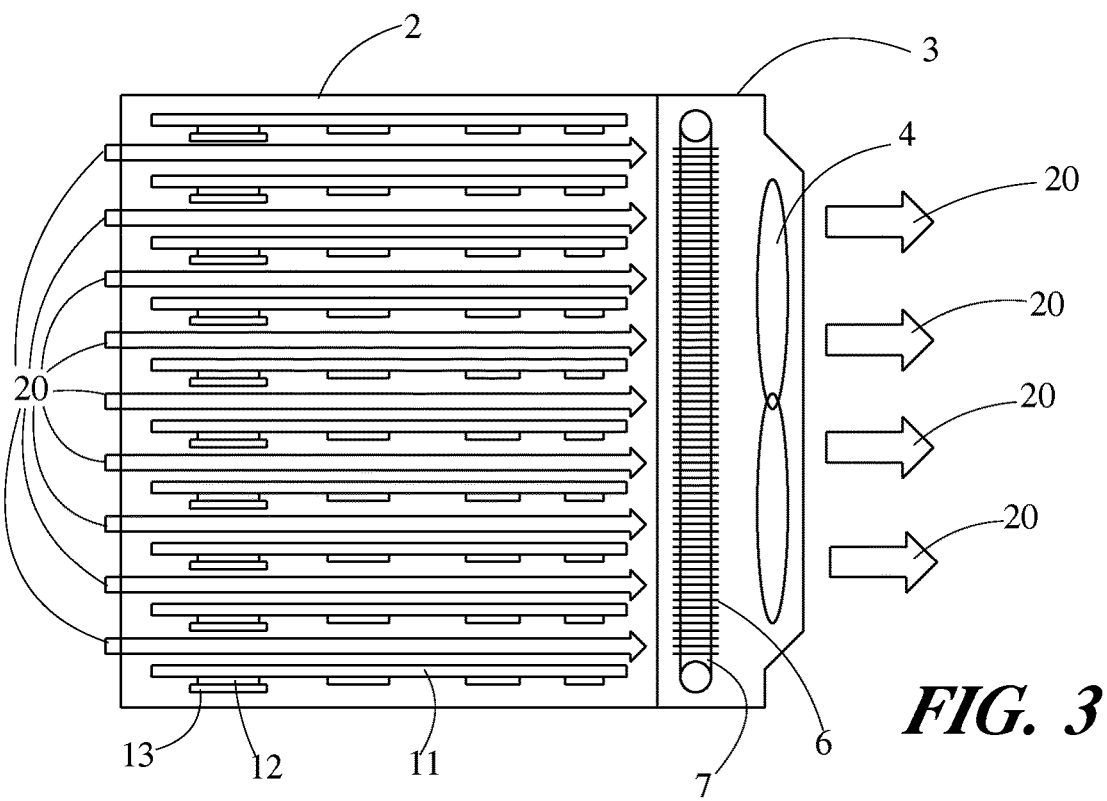
FIG. 3 is a diagram showing the flow of air through an electronics cabinet in the cooling system of FIG. 1.

A cooling system 1 for an electronics cabinet 2 is depicted in FIGS. 1-3, and includes a door heat exchanger 3 that is mounted to a face of the cabinet 2. The door heat exchanger 3 is supplied with one or more fans 4 that are configured to draw ambient air surrounding the cabinet 2 through the cabinet in order to partially cool electronics housed within the cabinet.

In a typical installation, the electronics cabinet 2 will be one of many such cabinets arranged within a data room or a data center, although in some applications there may be only a single one or a few electronics cabinets 2. In order to prevent the accumulation of heat from the electronics housed within the one or more electronics cabinets 2 from raising the temperature of the surrounding air to an unacceptably high level an inhibiting the requisite cooling of the electronics, the heat dissipated by the electronics is removed to a location that is remote from the location of the electronics cabinets 2. To that end, the cooling system 1 includes a heat rejection system 10 that is located remotely from the electronics cabinets 2.

The heat rejection system 10 is coupled to the door heat exchanger 3 by way of a coolant loop 8. In some especially preferable embodiments, the heat rejection system 10 is a chiller that circulates coolant along the coolant loop 8. The chiller is preferably located outside of the building containing the electronics cabinets and rejects heat from the circulating coolant to the outside air, either directly or indirectly. When the chiller receives the circulating coolant at a temperature that exceeds the outside air temperature, direct transfer of heat from the coolant to the air can be achieved. Such a mode of operation is commonly referred to as "free-cooling". In other instances the outside air temperature is too high to allow for proper chilling of the coolant using only direct heat transfer. In such instances, a vapor compression circuit within the chiller can be operated to remove heat from the circulating coolant by evaporating refrigerant at a low temperature and pressure and subsequently rejecting the heat from the vaporized refrigerant to the air at a higher temperature and pressure. In other embodiments the heat can be rejected to a ground loop or to a body of water, instead of to the outside air. In any event, the heat rejection system 10 operates to receive the coolant from the electronics cabinet by way of the coolant loop 8 at one temperature, and to return the coolant to the electronics cabinet 2 by way of the coolant loop 8 at another, lower temperature.

The coolant that is circulated along the coolant loop 8 can be any variety of coolant, including water, glycol, a water-glycol mixture, thermal oil, refrigerant, or any other known liquid, vapor, or liquid-vapor fluid generally used as a coolant. The coolant loop 8 can include a variety of fluid conduits to connect the components arranged along the coolant loop 8 (including but not limited to the heat rejection system 10 and the door heat exchanger 3). By way of example, the coolant loop 8 can include flexible hoses, rigid metal and/or plastic piping or tubing, etc.

The flow of heat energy into the coolant loop 8 is depicted schematically in FIG. 2. Coolant is circulated from the heat rejection system 10 to the door heat exchanger 3 along the coolant loop 8, and is thereby delivered to the door heat exchanger 3 at a first coolant temperature. The circulation of the coolant is, in some especially preferable embodiments, achieved by way of a pump or other fluid circulating device that is integrated within the heat rejection system 10, although in some other embodiments the pump or fluid circulating device may be located elsewhere along the coolant loop 8. The coolant flowing through the coolant loop 8 is routed through the door heat exchanger 3, wherein it receives thermal energy from the air 20 that is induced to flow through the cabinet 2, thereby raising the temperature of the coolant to a second temperature that is higher than the first temperature.

After having circulated through the door heat exchanger 3, the coolant is next directed to a coolant-to-coolant heat exchanger 15 that is arranged within the electronics cabinet 2. Within the coolant-to-coolant heat exchanger 15, additional thermal energy is transferred to the coolant flowing along the coolant loop 8 from another flow of coolant flowing along a second coolant loop 9. For ease of description, the coolant loop 8 will be referred to as the first coolant loop, and the coolant loop 9 will be referred to as the second coolant loop.

The coolant-to-coolant heat exchanger 15 can have any of several known forms of heat exchanger construction that provides fluid separation between two separate fluid flows while simultaneously providing heat transfer contact between the two flows. By way of example, such constructions include plate and frame, coaxial tube, shell and tube, nested shell, stacked plate, and bar and plate, among others.

The second coolant loop 9 is contained within the electronics cabinet 2, and circulates a flow of coolant between the coolant-to-coolant heat exchanger 15 and multiple cold plates 13 that are arranged within the electronics cabinet 2. Heat dissipating electronic components 12 are mounted to the cold plates 13 in order to reject heat produced by the electronic components 12 directly to the cold plates 13. As the coolant circulating along the second coolant loop 9 passes through the cold plates 13, the heat that is rejected from the electronic components 12 to the cold plates 13 is absorbed by the coolant passing therethrough.

The electronic components 12 that are mounted to the cold plates 13 can be a selected few of the total number of electronic components housed within the electronics cabinet 2. It can be particularly advantageous for those ones of the electronic components that dissipate heat at a rate that substantially exceeds the average heat dissipation rate of the electronic components to be mounted to cold plates 13, so that a substantial portion of the total heat load dissipated within the cabinet 2 can be efficiently transferred to the second coolant loop 9 with relatively few cold plates 13. Since the direct transfer of heat from electronic components to cold plates can be achieved significantly more efficiently than the transfer of heat into the air 20, the flow rate of the air 20 through the electronics cabinet 2 can be reduced.

The flow of coolant along the second coolant flow path 9 is manifolded into multiple hydraulically parallel flow paths that each pass through one or more of the cold plates. Such manifolding can be accomplished by first directing the coolant from the coolant-to-coolant heat exchanger 15 to a first manifold 17, and from there directing the flow of coolant along the multiple parallel paths. After passing through the cold plates 13, the multiple parallel coolant paths are recombined in a second manifold 18, from which the flow of coolant can be returned to the coolant-to-coolant heat exchanger 15, thereby competing the second coolant loop. It should be noted that the coolant flowing along the second coolant loop 9 can additionally be used to cool other components within the electronics cabinet 2, for example power conversion equipment, uninterruptable power supplies, and the like. These components can be arranged at any location along the coolant loop 9, such as between the coolant-to-coolant heat exchanger 15 and the first manifold 17, between the second manifold 18 and the coolant-to-coolant heat exchanger 15, or between the first and second manifolds 17 and 18 in parallel with the cold plates 13.

The coolant-to-coolant heat exchanger can be—but need not necessarily be—part of a fluid distribution unit 14 that is arranged within the electronics cabinet 2. The fluid distribution unit 14 can include the coolant-to-coolant heat exchanger 15 as well as other ancillary equipment, such as a fluid pump 16 to direct the flow of coolant along the second coolant loop 9.

The coolant that is circulated along the second coolant loop 9 can be any variety of coolant, including water, glycol, a water-glycol mixture, thermal oil, refrigerant, or any other known liquid, vapor, or liquid-vapor fluid generally used as a coolant. The coolant of the second coolant loop 9 can be the same type of coolant as the coolant of the first coolant loop 8, but it need not be the same. In certain especially preferable embodiments, the coolant of the second coolant loop 9 is a pumped refrigerant coolant. The use of pumped refrigerant is known to allow for high heat transfer efficiencies, but has the disadvantage of being higher in cost. However, that disadvantage is reduced in the exemplary system, since the coolant loop 9 is contained entirely within the electronics cabinet 2, thereby reducing the overall volume of the second coolant loop.

By virtue of the transfer of heat into the coolant flowing along the first coolant loop 8 within the coolant-to-coolant heat exchanger 15, that coolant is additionally heated to a third temperature greater than the second temperature. The coolant is subsequently returned to the heat rejection system 10 along the first coolant loop 8. It should be understood that additional components can be arranged along the coolant loop 8, so that further heat transfer into or out of the coolant loop 8 can be achieved between the electronics cabinet 2 and the heat rejection system 10. By way of example, some of the heat that was transferred into the coolant in the door heat exchanger 3 and the coolant-to-coolant heat exchanger 15 can be recovered from the coolant loop 8 prior to the heat rejection system 10 in order to provide useful process heat elsewhere. As another example, the coolant loop 8 can also be used to cool additional heat loads (for example, uninterruptible power supplies or electrical transformers).

The air flow 20 through the electronic cabinet 2 is achieved by way of one or more air movers or fans 4 that are provided within the door heat exchanger 3. As best seen in FIG. 3, the flow of air 20 is drawn into the cabinet 2 through a face of the cabinet that is opposite the location of the door heat exchanger 3. That face of the cabinet can be provided with vents, louvers, perforations, or other openings to allow for the inflow of the air. Within the electronics cabinet 2, the air 20 passes over electronics assemblies 11 that are preferable arranged in parallel with spaces between adjacent ones to allow for the passage of the air 20. Heat dissipating electronics, including those heat dissipating electronics 12 that are mounted to cold plates 13, are provided as part of the electronics assemblies 11. As the air 20 passes over the electronics assemblies 11, heat dissipated by the electronics is convectively transferred into the air flow 20, thereby raising the temperature of the air flow 20 as it passes through the cabinet 2.

After having been heated by the electronic assemblies 11, the air flow 20 passes through the door heat exchanger 3 to exit the cabinet 2 and be returned to the room. The door heat exchanger 3 includes coolant tubes 7 to convey the first coolant flow through the door heat exchanger 3, with extended heat exchange surfaces 6 joined to the coolant tubes 7. The heat exchange surfaces 6 can, for example, be plate fins with holes through which the coolant tubes extend. In some embodiments the heat exchange surfaces 6 can be convoluted fins that are arranged between flat coolant tubes 7. The heat exchange surfaces 6 are preferably in good thermal contact with the coolant tubes 7, such as by being integral to the tubes 7 or by being joined through brazing, soldering, welding, mechanical expansion, or the like.

As the flow of air 20 passes over the heat exchange surfaces 6, some or all of the heat that was transferred to the air from the electronic assemblies 11 is convectively transferred to the coolant passing through the coolant tubes 7. The coolant tubes 7 are part of the first coolant loop 8, so that the coolant that is received into the door heat exchanger 3 from the heat rejection system 10 along the coolant loop 8 is the coolant that is circulated through the coolant tubes 7. In some especially preferable modes of operation, the rate of heat transfer into the flow of coolant passing through the coolant tubes 7 is equal to the rate of heat transfer into the air flow 20 from the electronic assemblies 11, so that the flow of air 20 exits the door heat exchanger 3 at the same temperature that it enters the electronics cabinet 2. In this way, the net rate of heat transfer into the room air is zero, and the room is able to stay at a steady-state temperature with no or minimal need for computer room air conditioning.

Figure 4:
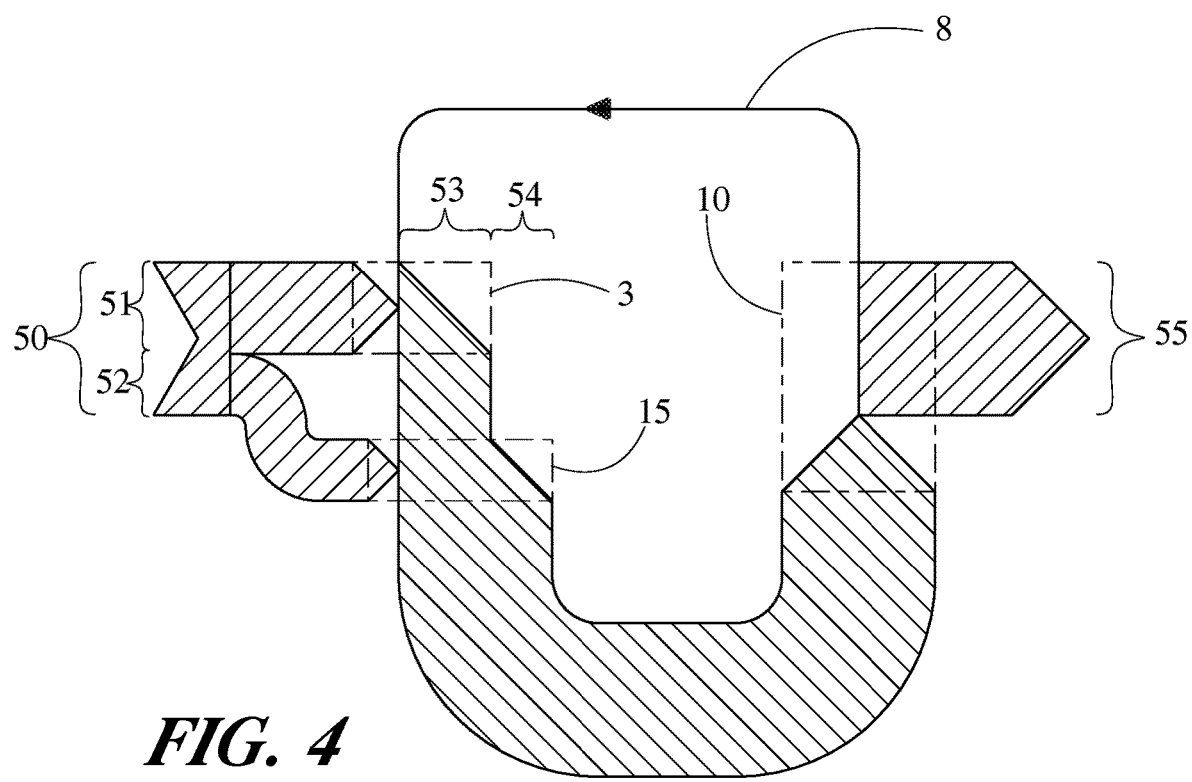
FIG. 4 is a heat flow diagram for the cooling system of FIG. 1.

The flow of thermal energy into the coolant loop 8 can be depicted by way of a Sankey diagram, as in FIG. 4. In such a diagram, the movement of energy is depicted using connected arrows, where the width of the arrow indicates the magnitude of the energy flow rate. The heat flow is depicted as moving from left to right, starting with a flow rate (depicted by the arrow width 50) representing the total rate of heat dissipation from the electronic assemblies 11, including the electronic components 12. That total rate of heat dissipation 50 includes a first portion 51 that is convectively transferred to the air flow 20, and a second portion 52 that is transferred to the second coolant loop 9 through the cold plates 13.

Within the door heat exchanger 3, heat is transferred to the first coolant loop 8 from the flow of air 20 at a heat transfer rate 53. The heat transfer rate 53 is preferably equal to the heat transfer rate 51, in which case the flow of air 20 is returned to the room at a temperature equal to that at which it entered the electronics cabinet 2. In some operating conditions, the heat transfer rate 53 may be less than the heat transfer rate 51, in which case the temperature of the air in the room will slowly rise until, eventually, steady-state operation is achieved and the rates 53, 51 are equal. Similarly, the heat transfer rate 53 may, in some operating conditions, be less than the heat transfer rate 51. In such cases the temperature of the air in the room will slowly decrease until steady-state operation is achieved.

As further shown in FIG. 4, heat is transferred from the second coolant loop 9 into the first coolant loop 8 at a heat transfer rate 54 in the coolant-to-coolant heat exchanger 15. The heat transfer rate 54 is preferably equal to the heat transfer rate 52, in which case coolant flowing along the second coolant loop 9 leaves the coolant-to-coolant heat exchanger 15 at a consistent temperature. However, in some operating conditions the heat transfer rate 54 may be greater or less than the heat transfer rate 52, so that the coolant exiting the coolant-to-coolant heat exchanger along the second coolant loop 9 gradually decreases or increases in temperature until steady-state operation is achieved.

It can be observed that the total increase in enthalpy of the coolant flowing through the door heat exchanger 3 and electronics cabinet 2 is equal to the sum of the heat transfer rates 53 and 54. Heat is subsequently transferred out of the coolant loop 8 within the heat rejection system 10 at a heat transfer rate 55. When the heat transfer rate 55 is equal to the sum of the heat transfer rates 53 and 54, then the coolant loop 8 can be considered to be at a steady-state operating condition, so that the temperature of the coolant being delivered to the door heat exchanger 3 is help constant.

The diagram of FIG. 4 is depicted for only a single electronics cabinet. It should be understood that a coolant loop 8 can alternatively be configured to direct coolant to multiple such electronics cabinets in parallel, so that the rate of heat transfer 55 is equal to the heat transferred to the coolant loop 8 from all of the multiple electronics cabinets. By operating the cooling system 1 in this manner, the total heat dissipation rate 50 of the electronics within the electronic cabinets 2 can potentially be accommodated without requiring a computer room air conditioning (CRAC) unit to maintain the temperature of the air inside the room housing the electronics cabinets 2.

Figure 5:
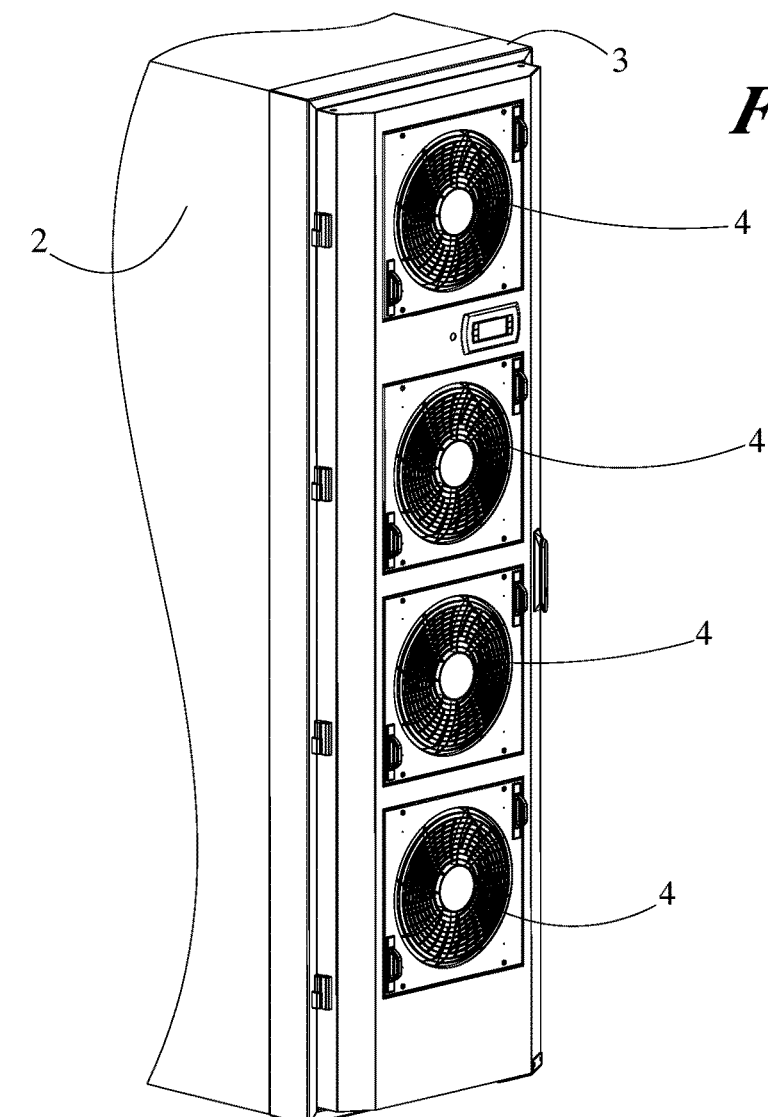
FIG. 5 is a partial perspective view of a portion of the cooling system of FIG. 1.
Figure 6:
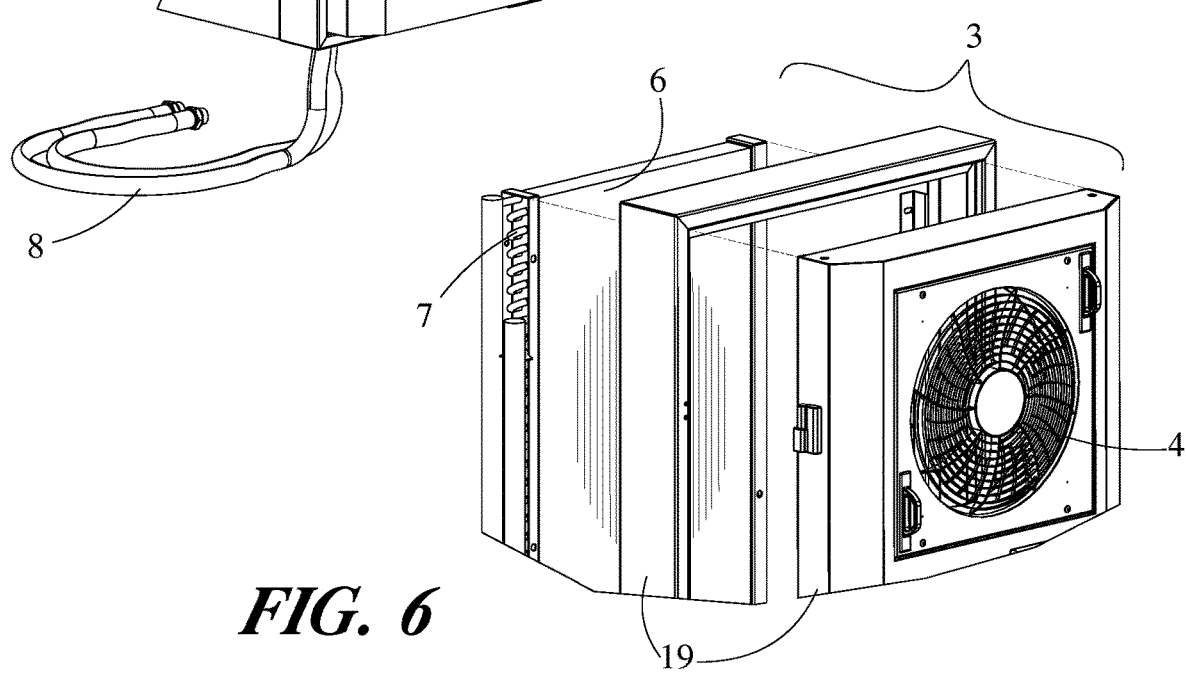
FIG. 6 is a partially exploded detail view of a portion of the cooling system of FIG. 1.

FIGS. 5 and 6 depict a typical door heat exchanger for use in the present invention in more detail. As can be seen, the door heat exchanger 3 can be constructed using multiple frame pieces 19 that provide a mounting structure for both the fans 4 and for the coolant tubes 7 and heat exchange surfaces 6. The door heat exchanger 3 can be mounted to a face of the electronics cabinet 2 by one or more of the frame pieces 19.

Figure 7:
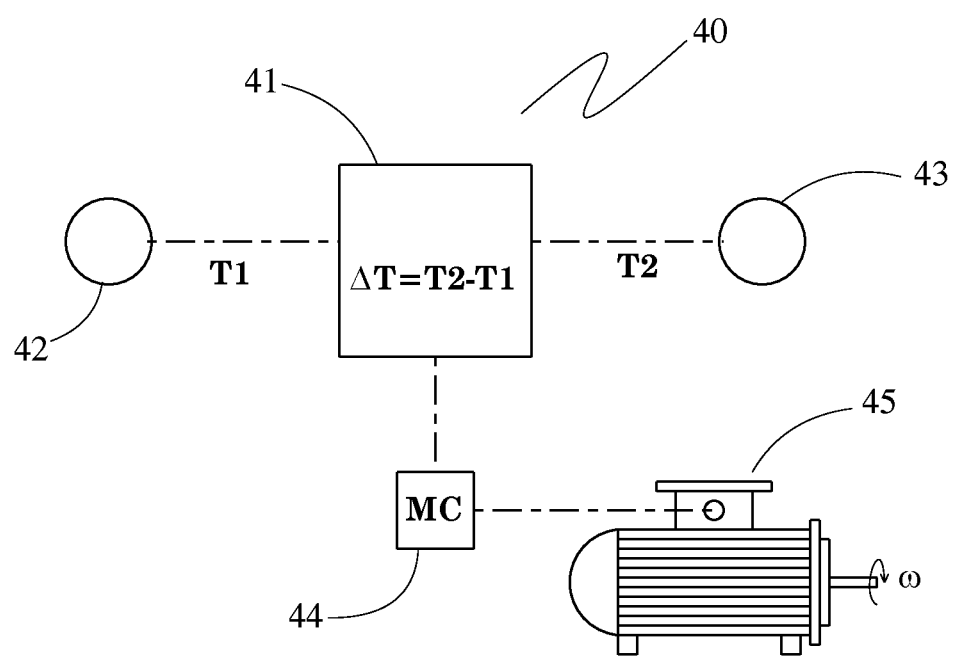
FIG. 7 is a schematic representation of a control circuit of the cooling system of FIG. 1.

The cooling system 1 can include a control circuit 40 (depicted in schematic fashion in FIG. 7) to control the cooling performance of the cooling system 1. The control circuit 40 includes a controller 41 that is coupled to a first temperature sensor 42 and a second temperature sensor 43 to receive electronic signals therefrom. The controller 41 can be any type of electronic controller, including but not limited to an integrated circuit, a programmable logic controller, or a digital computer. The controller 41 can be located within the electronics cabinet 2 (including but not limited to within the door heat exchanger 3) but can also be located outside of the electronics cabinet 2.

The first temperature sensor 42 is arranged to measure the temperature (T1) of the air 20 as it enters the electronics cabinet 2, and conveys that temperature T1 as an electronic signal to the controller 41. The sensor 42 can be located within the electronics cabinet 2 at or near the location where the air flow enters the cabinet 2. Alternatively, the sensor 42 can be located within the room that houses the electronics cabinet 2 at a location that is in relatively close proximity to the electronics cabinet 2, so that the temperature sensor 42 measures the temperature T1 by measuring the ambient air temperature at that location. Such an arrangement can allow for a single temperature sensor 42 to provide the air inlet temperature T1 for multiple electronics cabinets 2.

The second temperature sensor 43 is arranged to measure the temperature (T2) of the air 20 as it exits the electronics cabinet 2, and conveys that temperature T2 as an electronic signal to the controller 41. The sensor 43 is therefore preferably located within the door heat exchanger 3 at a location where it encounters the flow of air after the flow of air has passed over the extended heat exchange surfaces 6, so that the air will have rejected heat to the coolant flow passing through the tubes 7 prior to passing over the temperature sensor 43.

The controller operates to measure a temperature differential ($\Delta T$) as the difference between the temperature T2 and the temperature T1. In operating conditions where the rate of heat transfer 53 is greater than the rate of heat transfer 51, the temperature differential will have a positive value, whereas it will have a negative value when the rate 51 is greater than the rate 53.

The controller is programmed to send an electronic signal to one or more motor controllers 44 in response to the temperature differential. The motor controller 44 is electrically connected to a motor 45 in order to drive that motor at a commanded rotational speed $\omega$. The motor 45 can be, by way of example, a fan hub motor for one of the fans 4. Alternatively, the motor 45 can be a motor to drive the pump 16. It should be understood that the motor 45 is not limited to any particular type of motor.

In accordance with the programmed instructions of the controller 41, the operation of one or more motors 45 is adjusted in response to the calculated temperature differential in order to modulate the flow of one or more fluid flow of the cooling system 1. In one especially advantageous embodiment, the controller 41 increases the speed of the fans 4 when the temperature differential is positive (e.g. when the air exiting the electronics cabinet 2 is higher in temperature than the air entering the electronics cabinet 2) in order to increase the flow rate of the air 20 through the cabinet. The increased flow rate of the air will tend to increase the rate of heat transfer 53 from the air to the coolant flow within the door heat exchanger 3, so that the temperature of the air in the room can be maintained at an acceptable level. The controller can decrease the speed of the fans 4 when the temperature differential is negative in order to operate at a more efficient fan speed. The controller can additionally or alternatively be programmed to respond to the temperature level T1 itself, in order to regulate the room temperature.

In some embodiments, the controller 41 can additionally or alternatively adjust the speed of the pump 16 in order to increase or decrease the flow rate of coolant along the coolant loop 9 in response to the temperature differential. By doing so, the rate of heat transfer 52 into the coolant loop 9 can be modulated so that more heat is removed from the electronic modules 11 when the temperature differential is positive. This will result in a smaller portion of the total rate of heat dissipation 50 being transferred to the cooling air 20, so that the rate of heat rejection into the air of the room can be reduced. The flow rate of the coolant along the coolant loop 8 can also be adjusted by the controller 41.

Various alternatives to the certain features and elements of the present invention are described with reference to specific embodiments of the present invention. With the exception of features, elements, and manners of operation that are mutually exclusive of or are inconsistent with each embodiment described above, it should be noted that the alternative features, elements, and manners of operation described with reference to one particular embodiment are applicable to the other embodiments.

The embodiments described above and illustrated in the figures are presented by way of example only and are not intended as a limitation upon the concepts and principles of the present invention. As such, it will be appreciated by one having ordinary skill in the art that various changes in the elements and their configuration and arrangement are possible without departing from the spirit and scope of the present invention.

What is claimed is:

1. A method of cooling an electronics cabinet, comprising:
    inducing a flow of cooling air to enter into an electronics cabinet at a first temperature;
    passing the flow of cooling air over a plurality of electronic modules arranged within the electronics cabinet to convectively transfer heat to the flow of cooling air from the plurality of electronic modules at a first heat transfer rate;
    directing the flow of cooling air through a door heat exchanger arranged at an end of the electronics cabinet to exhaust the flow of cooling air from the electronics cabinet at a second temperature;
    receiving a first coolant flow into the electronics cabinet;
    directing the first coolant flow through the door heat exchanger;
    transferring heat from the flow of cooling air to the first coolant flow at a second heat transfer rate as the flow of cooling air and the first coolant flow both pass through the door heat exchanger;
    directing the first coolant flow through a coolant-to-coolant heat exchanger arranged within the electronics cabinet;
    circulating a second coolant flow through a coolant loop arranged within the electronics cabinet, the coolant-to-coolant heat exchanger being located along said coolant loop;
    passing the second coolant flow through a plurality of cold plates joined to at least some of the plurality of electronic modules to transfer heat therefrom to the second coolant flow at a third heat transfer rate;
    transferring heat from the second coolant flow to the first coolant flow at a fourth heat transfer rate as the first and second coolant flows both pass through the coolant-to-coolant heat exchangers;
    removing the first coolant flow from the electronics cabinet; and
    rejecting heat from the first coolant flow at a location remote from the electronics cabinet.

2. The method of claim 1, wherein the sum of the first heat transfer rate and the third heat transfer rate is equal to the total rate of heat generation of the plurality of electronic modules.

3. The method of claim 1, wherein the fourth heat transfer rate is equal to the third heat transfer rate.

4. The method of claim 1, wherein the second heat transfer rate is equal to the first heat transfer rate.

5. The method of claim 1, wherein the second temperature is equal to the first temperature.

6. The method of claim 1, wherein the coolant-to-coolant heat exchanger is arranged downstream of the door heat exchanger with respect to the first coolant flow as the first coolant flow travels through the electronics cabinet.

7. The method of claim 1, wherein the step of rejecting heat from the first coolant flow at a location remote from the electronics cabinet includes operating a chiller to reject heat from the first coolant flow to ambient air.

8. The method of claim 1, further comprising combining the first coolant flow with coolant flows from one or more additional electronics cabinets after removing the first coolant flow from the electronics cabinet but before rejecting heat from the first coolant flow at a location remote from the electronics cabinet.

9. The method of claim 1, further comprising:
measuring the first temperature;
measuring the second temperature;
comparing the second temperature to the first temperature to determine a temperature differential; and
changing the flow rate of at least one of the flow of ambient air, the first coolant flow, and the second coolant flow in response to the temperature differential.

10. The method of claim 9, wherein changing the flow rate includes increasing the flow rate of at least one of the flow of ambient air, the first coolant flow, and the second coolant flow when the second temperature exceeds the first temperature, and decreasing the flow rate of at least one of the flow of ambient air, the first coolant flow, and the second coolant flow when the first temperature exceeds the second temperature.

11. The method of claim 9, wherein changing the flow rate includes adjusting the speed of one or more fans in response to the temperature differential.

12. The method of claim 9, wherein changing the flow rate includes adjusting the speed of a coolant pump in response to the temperature differential.

13. A cooling system for an electronics cabinet, comprising:
a door heat exchanger mounted to a face of the electronics cabinet, the door heat exchanger including one or more fans to draw cooling air through the electronics cabinet and to pass the cooling air over heat exchange surfaces of the door heat exchanger;
a heat rejection system located remotely from the electronics cabinet;
a first coolant loop fluidly coupling the heat rejection system to the door heat exchanger to deliver coolant from the heat rejection system to the door heat exchanger, the first coolant loop extending through the door heat exchanger to receive heat from the cooling air by way of the heat exchange surfaces;
a plurality of cold plates arranged within the electronics cabinet and coupled to electronic components contained in the electronics cabinet;
a second coolant loop arranged within the electronics cabinet, the plurality of cold plates being connected to the second coolant loop to transfer heat from said electronic components to the second coolant loop; and
a coolant-to-coolant heat exchanger arranged within the electronics cabinet and connected to both the first coolant loop and the second coolant loop to transfer heat from the second coolant loop to the first coolant loop.

14. The cooling system of claim 13, wherein the coolant-to-coolant heat exchanger is arranged downstream of the door heat exchanger along the first coolant loop.

15. The cooling system of claim 13, wherein the coolant-to-coolant heat exchanger is part of a fluid distribution unit arranged within the electronics cabinet, the fluid distribution unit further comprising a pump to circulate a flow of coolant along the second coolant loop.

16. The cooling system of claim 15, further comprising a first and a second header arranged within the electronic cabinet along the second coolant loop, the first header fluidly connected to the fluid distribution unit and to the plurality of cold plates to receive a flow of coolant from the fluid distribution unit and to distribute said flow of coolant to the plurality of cold plates, the second header fluidly connected to the fluid distribution unit and to the plurality of cold plates to receive said flow of coolant from the plurality of cold plates and to return said flow of coolant to the fluid distribution unit.

17. The cooling system of claim 13, wherein the heat rejection system includes a chiller.

18. The cooling system of claim 13, wherein the first cooling loop is fluidly in parallel with cooling loops of additional electronics cabinets.

19. The cooling system of claim 13, further comprising:
a first temperature sensor arranged to measure the temperature of the cooling air as it enters the electronics cabinet;
a second temperature sensor arranged to measure the temperature of the cooling air as it exits the electronics cabinet;
a controller in communication with the first and second temperature sensors to receive signals therefrom; and
one or more motor controllers in communication with the controller, the controller being configured to change a speed command from the one or more motor controllers in response to the signals from the first and second temperature sensors.

20. The cooling system of claim 19, wherein the one or more motor controllers are electrically connected to the one or more fans to control the speed of the one or more fans.

* * * * *